(12) United States Patent
Chen et al.

(10) Patent No.: US 8,270,245 B2
(45) Date of Patent: *Sep. 18, 2012

(54) MEMORY DEVICE

(75) Inventors: Chung-Kuang Chen, Pan Chiao (TW);
Yi-Te Shih, Zhubei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/050,142

(22) Filed: Mar. 17, 2011

(65) Prior Publication Data

US 2011/0164461 A1 Jul. 7, 2011

Related U.S. Application Data

(63) Continuation of application No. 12/391,351, filed on Feb. 24, 2009, now Pat. No. 7,936,634.

(60) Provisional application No. 61/048,247, filed on Apr. 28, 2008.

(51) Int. Cl.
*G11C 8/00* (2006.01)
(52) U.S. Cl. ............... 365/230.02; 365/230.03
(58) Field of Classification Search ......... 365/230.02, 365/230.03, 230.06, 185.23
See application file for complete search history.

(56) References Cited

U.S. PATENT DOCUMENTS

| | | | |
|---|---|---|---|
| 6,026,021 | A | 2/2000 | Hoang |
| 6,307,804 | B1 | 10/2001 | Ooishi |
| 6,335,889 | B1 | 1/2002 | Onodera |
| 6,711,066 | B2 | 3/2004 | Tanzawa et al. |
| 2004/0151015 | A1 * | 8/2004 | Do .............. 365/94 |

* cited by examiner

*Primary Examiner* — Anh Phung
(74) *Attorney, Agent, or Firm* — Thomas|Kayden

(57) ABSTRACT

A memory device comprises first memory block having first boundary cell and second memory block having second boundary cell. Data of the first and the second boundary cells are outputted simultaneously corresponding to a plurality of column selection signals.

16 Claims, 5 Drawing Sheets

MEMORY DEVICE

This application is a continuation application of application Ser. No. 12/391,351, filed on Feb. 24, 2009, now U.S. Pat. No. 7,936,634, issued on May 3, 2011, which claims a provisional application Ser. No. 61/048,247, filed Apr. 28, 2008. These related applications are incorporated herein by reference.

BACKGROUND OF THE INVENTION

1. Field of the Invention

The invention relates in general to a memory control circuit, and more particularly to a memory control circuit performing erase verification operation on a memory array of a memory.

2. Description of the Related Art

Referring to FIG. 1, a schematic illustration of a conventional memory is shown. In an example, a memory array MA includes memory banks BNK0 to BNKN, each of which includes M memory blocks, wherein N is a natural number greater than 1 and M is a natural number greater than 1. For example, the memory bank BNK0 includes memory blocks BLO1 to BLOM. Since an erase process and an erase verification process performed on each of the memory blocks BLO1 to BLOM are similar, only the process performed on the memory block BLO1 is cited as an example described in the following paragraphs.

The memory block BLO1 includes memory cells Ce1 to Ce7, and boundary memory cell CB, each of which is for storing 2 bit data. For example, the boundary memory cell CB stores bit data BT1 and BT2. Generally, in an erase verification process performed on the memory block BLO1, data stored in the memory cells Ce1 to Ce7 and the boundary memory cell CB are sensed for determining whether the memory block BLO1 is verified to be erased. If not, the erase process will be executed for erasing the memory block BLO1.

Bit data stored in the memory cells Ce1 to Ce7 and the bit data BT1 stored in the boundary memory cell CB are sensed and erased by a sense amplifier SE1 and a bias circuit BS1, which are both corresponding to the memory block BLO1. However, due to the circuitry structure of the memory block BLO1, bit data BT2 stored in the boundary memory cell CB is sensed by the sense amplifier SE1 corresponding to the memory block BLO1, but is erased by a bias voltage VB provided by a bias circuit BS2 corresponding to the memory block BLO2.

For example, when the bit data BT2 is erased, the bias voltage VB provided by the bias circuit BS2 is provided to the end of the boundary memory cell CB storing the bit data BT2 via the Y-multiplexer YM2, the bit line BL1', the bank selection switch Sel1 corresponding to the memory block BLO2. Thus, the sensed result corresponding to the bit data BT2 should be considered in the control of the bias circuit BS2 via which the erase voltage erasing the bit data BT2 stored in the boundary memory cell CB is provided.

Referring to FIG. 2, a schematic illustration of the Y-multiplexers in FIG. 1 is shown. In FIG. 2, only the Y-multiplexers YM1 to YM3 are shown as example. The Y-multiplexer YM1, YM2, and YM3 respectively includes data channels Ysa0 to Ysa3, Ysb0 to Ysb7, and Ysc0 to Ysc4. As shown in FIG. 2, each data channels Ysa0 to Ysa3, Ysb0 to Ysb7, and Ysc0 to Ysc4 are arranged in accordance with the sequence of the mark numbers and the data channels with the greatest mark numbers (i.e. 3, 7, and 4) correspond with the boundary memory cells of the corresponding memory blocks.

In an example, the mark numbers indicate the corresponding address value of an address Adr. For example, the data channels with mark number of 1, (i.e. Ysa1, Ysb1, and Ysc1) are enabled in response to the first value of the address Adr. The value of the address Adr is sequentially altered from its initial value to its terminal value.

When the address Adr indicates the value of 3, the bit data BT2 of the boundary memory cell CB of the memory block MLO1 is sensed by the sense amplifier SE1. According to the previous paragraphs, it can be obtained that the sensed bit data BT2 should be considered in the control of the bias circuit BS2. However, a bit data of a memory cell of the memory block MLO2, which is provided by the Y-multiplexer YM2 in response to the third value of the address Adr, is also sensed and outputted by the sense amplifier SE2. Thus, additional logic circuits and control signals are needed to control the operation of the bias circuit BS2 based on the two sensed result is a challenging task.

Furthermore, similar boundary situation will occur whenever two adjacent memory blocks corresponding to different numbers of data channels. Thus, it is challenging and time-consuming to design corresponding logic for all those logic control. Besides, once the order of the memory blocks is changed, all the logic circuits must be redesigned since the time of referencing the sensing result of the sense amplifier corresponding to the adjacent memory block is totally different. Therefore, it is desirable to design a circuit to simplify and unify the erase operation on the boundary of different memory blocks.

SUMMARY OF THE INVENTION

The invention is directed to a memory control circuit for performing erase verification on a memory circuit including lots of memory blocks. The memory control circuit can effectively simplify and unify the erase operation on the boundary of different memory blocks.

According to a first aspect of the present invention, a memory device is provided. The memory device includes a first memory block and a second memory block. The first memory block has a first boundary cell, and the second memory block has a second boundary cell. Data of the first and the second boundary cells are outputted simultaneously corresponding to a plurality of column selection signals.

According to a second aspect of the present invention, a memory device is provided. The memory device includes a first boundary channel and a second boundary channel. The first boundary channel corresponds to a first boundary bit, and the second boundary channel corresponds to a second boundary bit. The first and the second boundary channels output the first and the second boundary bits simultaneously corresponding to column selection signals.

The invention will become apparent from the following detailed description of the preferred but non-limiting embodiments. The following description is made with reference to the accompanying drawings.

DETAILED DESCRIPTION OF THE INVENTION

According to an embodiment of invention, a memory control circuit is provided to read the boundary data of the boundary cells of the corresponding memory blocks in response to one column selection signal. Thus, the operations of the logic circuits in each control units, which correspond with the respective memory blocks, can be simplified and unified.

Generally, in an erase verification operation performed on a particular memory block, data stored in the memory cells of the memory block are read and used to determine whether the corresponding memory cells are erased. For example, when the data has a value of 1, it is suggested that the corresponding memory cell is erased. When the data a value of 0, it is suggested that the corresponding memory cell is not erased. In the following passages, an example for an erase operation and an erase verification operation performed on a memory will be provided for detailed explanation.

Figure 1:
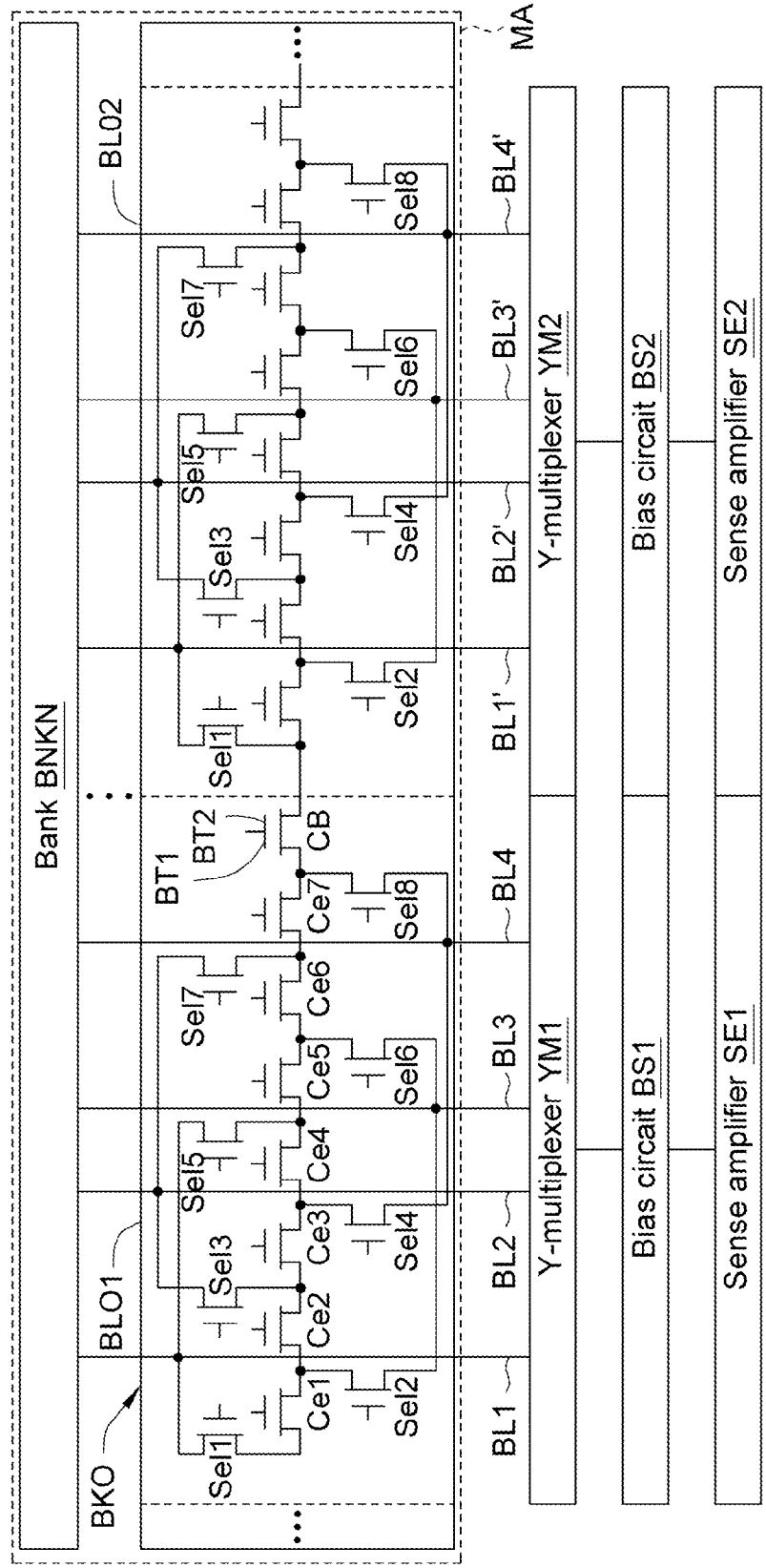
FIG. 1 (Prior Art) is a schematic illustration of a conventional memory.
Figure 2:
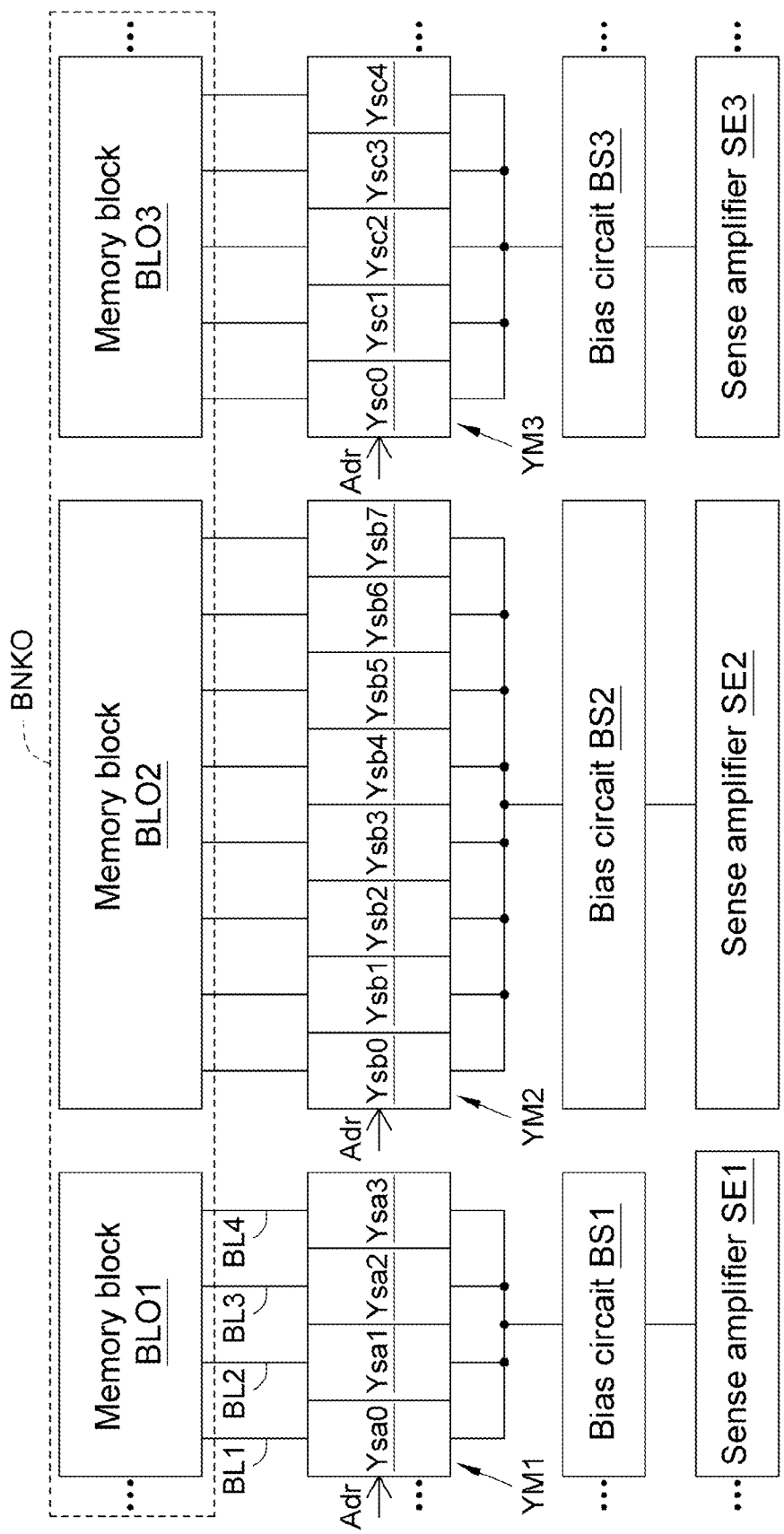
FIG. 2 (Prior Art) is a schematic illustration of the Y-multiplexer YM1 to YMM illustrated in the FIG. 1.
Figure 3:
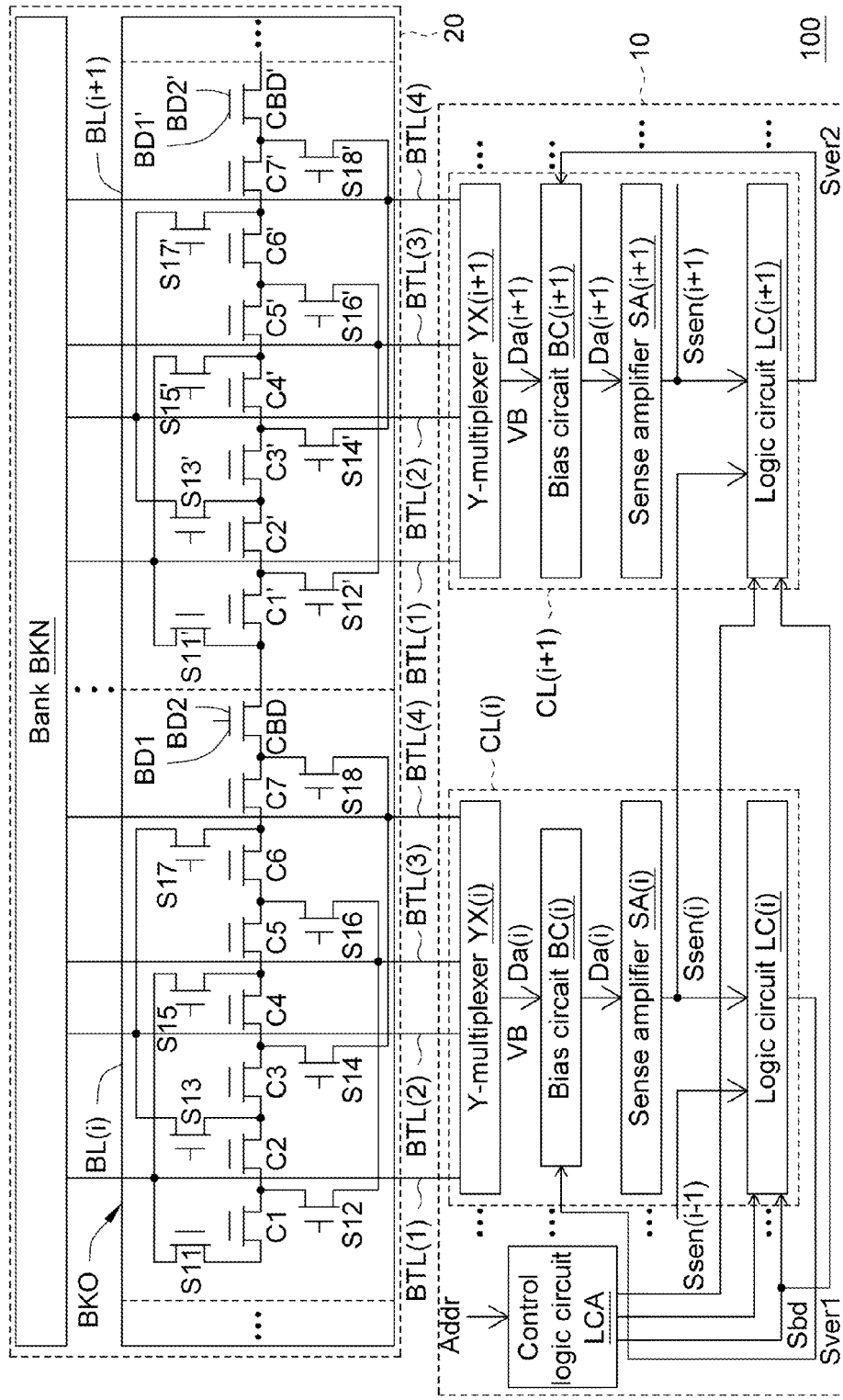
FIG. 3 is a block diagram of a memory control circuit 10 according to the embodiment of the invention.

Referring to FIG. 3, a block diagram of a memory control circuit 10 according to the embodiment of the invention is shown. The memory control circuit 10 is applied in a memory system 100 to perform an erase operation and an erase verification operation on a memory array 20. For example, the memory array 20 includes memory banks BK0 to BKN, each of which includes M memory blocks. M and N are natural numbers greater than 1. For example, the memory bank BK0 includes memory blocks BL(1) to BL(M). In FIG. 3, only the memory blocks BL(i) and BL(i+1) are shown, wherein i is a natural number smaller than M. In the following paragraphs, the erase operation and the erase verification operation performed on the memory block BL(i) and BL(i+1) are cited as examples for further explanation.

The memory block BL(i+1) includes memory cells C1 to C7 and a boundary memory cell CBD, each of which stores 2 bit data. Bank selection switches SI1 to SI8 are used for connecting the source/drain ends of the memory cells C1 to C7 and the boundary memory cell CBD to corresponding bit lines BTL1 to BTL4. Thus, data stored in the memory cells C1 to C7 and the boundary memory cell CBD can be outputted via the bit lines BTL1 to BTL4 and bias voltages can be applied to the corresponding source/drain end of the memory cells C1 to C7 and the boundary memory cell CBD.

The boundary memory cell CBD stores bit data BD1 and BD2. The bit data BD2 is a boundary bit data, which are sensed by the sense amplifier corresponding to the memory block BL(i) but are erased by the bias circuit BC(i+1) corresponding to the memory block BL(i+1), outputted via the bit line BTL4.

The memory block BL(j+1), which has a circuit structure substantially the same as that of the memory block BL(j), includes memory cells C1' to C7' and a boundary memory cell CBD', which stores bit data BD1' and BD2'. Bank selection switches SI1' to SI8' are used for connecting the source/drain of the memory cells C1' to C7' and the boundary memory cell CBD'. The bit data BD2' is a boundary bit data, which are sensed by the sense amplifier SA(i+1) corresponding to the memory block BL(i+1) but are erased by the bias circuit BC3 corresponding to the memory block BL(i+2), outputted via the bit line BTL4'.

The memory control circuit 10 includes a control logic circuit LCA and M control units CU(1) to CU(M) for controlling the M respective memory blocks BL(1) to BL(M). The control logic circuit LCA receives a column selection signal Addr to accordingly provide control signals for controlling the M control units CU(1) to CU(M).

The column selection signal Addr is capable of being a boundary value. When the column selection signal Addr indicates a boundary value, the control logic circuit LCA provides an enabled boundary control signal Sbd to the M control units CU(1) to CU(M). When the column selection signal Addr indicates value other than the boundary value, the control logic circuit LCA provides a disabled boundary control signal Sbd to the M control units CU(1) to CU(M).

The M control units CU(1) to CU(M) have substantially the same circuit structure and operation. In FIG. 3, only the control units CU(i) and CU(i+1), which correspond to the memory blocks BL(i) and BL(i+1) respectively, are shown. The control unit CU(i+1) includes a Y-multiplexer YX(i+1), a bias circuit BC(i+1), a sense amplifier SA(i+1) and a logic circuit LC(i+1). The control unit CU(i) includes a Y-multiplexer YX(i), a bias circuit BC(i), a sense amplifier SA(i), and a logic circuit LC(i), which perform substantially the same operation as the corresponding circuits in the control unit CU(i+1).

The Y-multiplexer YX(i+1) includes 4 data channels corresponding to the respective bit lines BTL1' to BTL4'. The Y-multiplexer YX(i+1) enables a data channel within it in response to a column selection signal Addr for outputting output data Da(i+1), which are stored in a selected memory cell in the memory block BL(i+1) and outputted via a corresponding bit line among the bit lines BTL1' to BTL4', to the sense amplifier SA(i+1). Besides, the Y-multiplexer YX(i+1) also enables a data channel connecting the bit lines BTL1' to BTL4' to the bias circuit BC(i+1). Similarly, the Y-multiplexer YX(i) has substantially the same circuit structure as the Y-multiplexer YX(i) and performs substantially the same operation as the Y-multiplexer YX(i+1).

The bias circuit BC(i+1) provides a bias voltage VB to the memory block BL(i+1) via the Y-multiplexer YX(i+1) so as to perform the erase operation on the memory block BL(i+1). The sense amplifier SA(i+1) senses data provided by the Y-multiplexer YX(i+1) for accordingly providing a sensing signal Ssen(i+1). Similarly, the bias circuit BC(i) performs an erase operation on the memory block BL(i) and the sense amplifier SA(i) accordingly provides a sensing signal Ssen(i).

The logic circuit LC(i+1) is for providing a verification signal Sver(i+1) indicating whether to control the bias circuit BC(i+1) to provide the bias voltage VB for performing the erase operation on the memory block BL(i+1). The logic circuit LC3(i+1) is, for example, implemented with a multiplexer, which provides the sensing signal Ssen(i) as a verification signal Sver(i+1) according to the enabled boundary control signal Sbd and provides the sensing signal Ssen(i+1) as the verification signal Sver(i+1) according to the disabled boundary control signal Sbd.

Similarly, the logic circuit LC(i) provides a verification signal Sver(i) indicating whether to control the bias circuit BC(i) to provide the bias voltage VB for performing the erase operation on the memory block BL(i). The logic circuit LC(i) provides a sensing signal Ssen(i−1) corresponding to a previous memory block of the memory block BL(i) (i.e. the memory block BL(i−1)) based on the enabled boundary control signal Sbd and provides the sensing signal Ssen(i) as the verification signal Sver(i) based on the disabled boundary control signal Sbd. For example, the sensing signal Ssen(i−1) corresponds to the boundary bit data of the memory block BL(i−1).

In an operation example, when the column selection signal Addr indicates the boundary value, the Y-multiplexer YX(i+1) and YX(i) respectively enable the data channel corresponding to the boundary bit data BD2' (i.e. the data channel corresponding to the boundary bit line BTL4') and the data channel corresponding to the boundary bit data BD2 (i.e. the data channel corresponding to the boundary bit line BTL4).

Thus, the sensing signal Ssen(i+1) corresponding to the boundary bit data BD2' and the sensing signal Ssen(i) corresponding to the boundary bit data BD2 can be obtained. Similarly, the sensing signal Ssen(i−1) corresponding to the boundary bit data of the memory block BL(i−1) can also be obtained.

In the meantime, the control logic circuit LCA provides the enabled boundary control signal Sbd. Thus, the logic circuits LC(i) and LC(i+1) select the sensing signals corresponding to the boundary bit data of their previous memory block (i.e. the sensing signal Ssen(i−1) and Ssen(i)) as the corresponding verification signals Sver(i) and Sver(i+1) when the column selection signal Addr indicates the boundary value.

In analogy, when the column selection signal Addr indicates the boundary value, the M logic circuits in the M control units CU(1) to CU(M) perform substantially the same operation to apply the sensing signals corresponding to the boundary bit data of their previous memory block as the corresponding verification signals. Thus, the boundary issue can be effectively solved and with simple and unified logic circuits and a control logic circuit.

The control logic circuit LCA further provides empty control signals Se(1) to Se(M) to respectively control the logic circuits within the control units CU(1) to CU(M). In the following paragraphs, an operation example of the memory control circuit 10 is described for further explanation of the operation controlled by those empty control signals.

Figure 4:
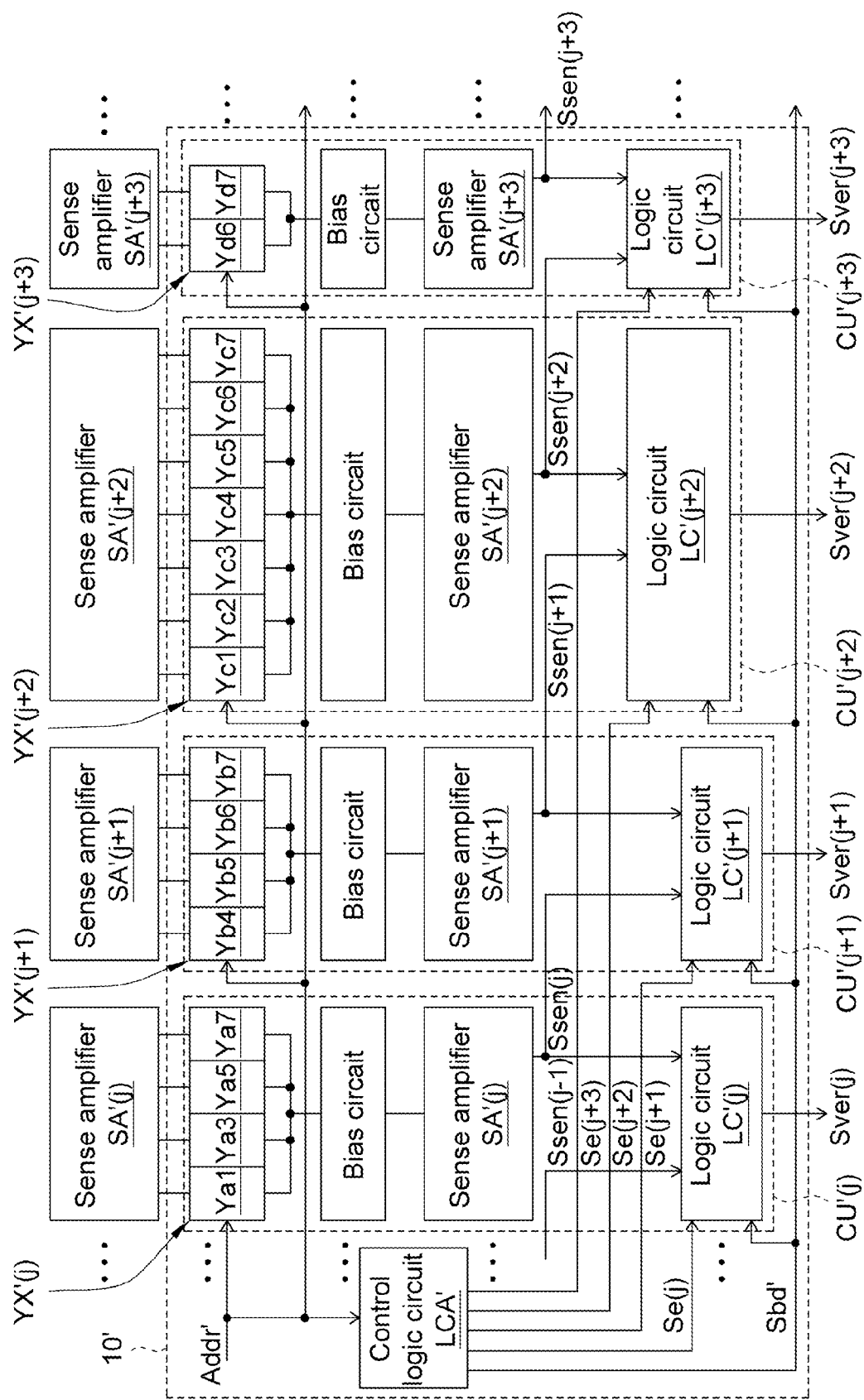
FIG. 4 is a schematic illustration of the memory control circuit according to the prevent embodiment of the invention.

Referring to FIG. 4, a schematic illustration of the memory control circuit according to the prevent embodiment of the invention is shown. The memory control circuit 10' includes M control units CU'(1) to CU'(M), but in FIG. 4, only the control units CU'(j) to CU'(j+3) are shown. The column selection signal Addr' is capable of having 7 values {1, 2, 3, 4, 5, 6, 7}. In an example, the value of the column selection signal Addr' is increased progressively form 1 to 7. After the column selection signal Addr' reaches the value of 7, the value of the column selection signal Addr' goes back to the value of 1.

In an example, the value of 7 of the column selection signal Addr' is designated as the boundary value. Thus, for all of the Y-multiplexers of the memory control circuit 10', the data channels corresponding to each of the boundary bit data are enabled in response to the column selection signal Addr' having the value of 7. For example, the Y-multiplexer YX'(j) to YX'(j+3) respectively have data channels Ya7, Yb7, Yc7, and Yd7, which respectively correspond with the boundary bit data of the memory block BL(j) to BL(j+3) and are enabled in response to the column selection signal Addr' having the value of 7. The mark numbers of 7 shown in the data channels Ya7, Yb7, Yc7, and Yd7 indicate the corresponding values (i.e. the value of 7) of the column selection signal Addr' for enabling them.

Except for the data channel Ya7 corresponding to the boundary bit data of the memory block BL(j), the Y-multiplexers YX'(j) further has data channels Ya1, Ya3, and Ya5, wherein the mark number 1, 3, and 5 indicates the corresponding values of the column selection signal Addr' for enabling the corresponding data channels Ya1, Ya3, and Ya5. In other words, when the column selection signal Addr' has the values of 1, 3, and 5, the corresponding data channels Ya1, Ya3, and Ya5 are respectively enabled for providing the corresponding bit data to the sense amplifier SA'(j) so as to provide a sensing signal Ssen(j) corresponding to those bit data.

However, when the selection signal Addr' has any one of the values of 2, 4, and 6, no data channels within the Y-multiplexer YX1'(j) are accordingly enabled and no bid data is sensed. Thus, the sensing signal Ssen(j) and the verification signal Sver(j) cannot be obtained and the erase verification process would come to a halt.

In the present example, when the column selection signal Addr' has any of those values of 2, 4, and 6, the control logic circuit LCA' provides an enabled empty control signal Se(j) for controlling the logic circuit LC'(j) to provide a default signal as the verification signal Sver(j) for outputting. In an example, the default signal has a value the same as the value that indicating a corresponding memory cell is erased successfully. Thus, the erase verification process can keep moving on to check whether the memory cell corresponding to the next data channel is verified to be erased or not.

Except for the data channel Yb7 corresponding to the boundary bit data of the memory block BL(j+1), the Y-multiplexer YX'(j+1) further has data channels Yb4, Yb5, and Yb6. Similarly, The control logic circuit LCA' provides a corresponding empty control signal Se(j+1) for controlling the corresponding logic circuit LC(j+1) to provide the default signal as the corresponding verification signal Sver(j+1) when the column selection signal Addr' has any of the values of 1, 2, and 3, which are not correspond to any of its data channels Yb4 to Yb7.

In analogy, the control logic circuit LCA' also provides other empty control signals Se for controlling the corresponding logic circuits to provide the default signal as the corresponding verification signal when the column selection signal Addr' has the value does not correspond to any of its data channel.

Figure 5:
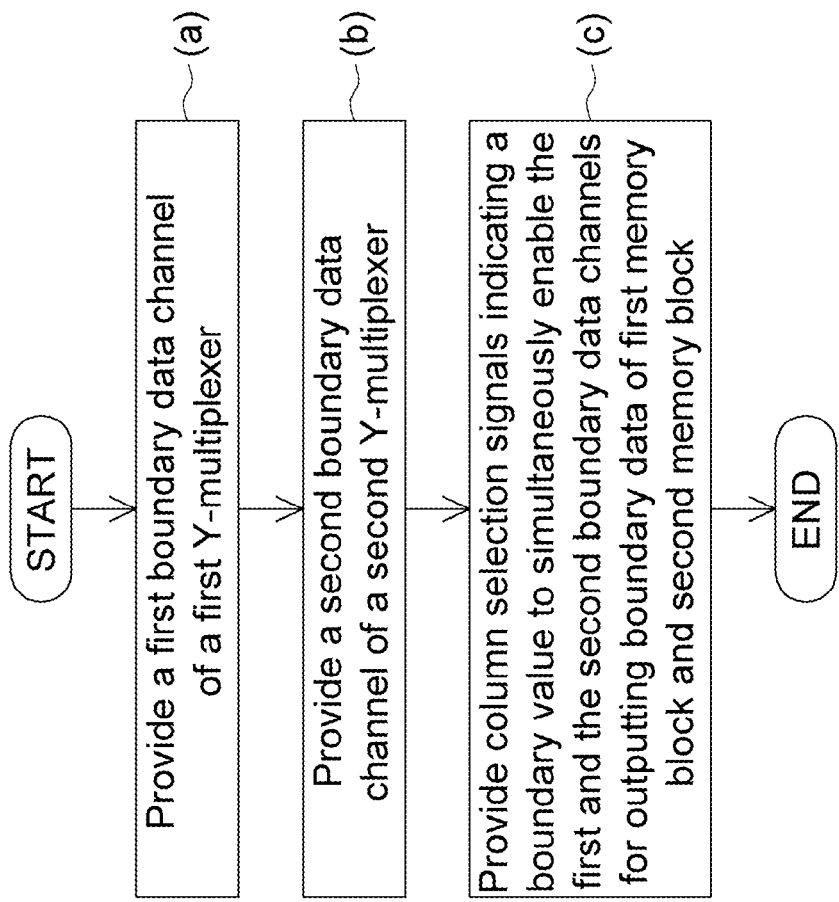
FIG. 5 is a flow chart of a method for memory accessing according to the present embodiment of the invention.

Referring to FIG. 5, a flow chart of a method for memory accessing according to the present embodiment of the invention is shown. Each and every steps of the method for memory accessing have been well disclosed in the previous paragraphs and the redundant description thereof is omitted.

Although only the situation that the Y-multiplexers YX'(j) to YX'(j+3) have the data channel structures shown in FIG. 4 is described as an example in the above paragraphs, the data channel structures of the Y-multiplexers YX'(j) to YX'(j+3) are not limited thereto. Except for the data channel corresponding to the boundary bit data should be designated with the same boundary value of the column selection signal Addr', the rest of data channels within the Y-multiplexers can be freely designated with the rest values of the column selection signal Addr'. For example, the Y-multiplexer YX'(j+1) can also have its 3 data channels respectively correspond to the column selection signal Addr' indicating the values of 1, 2, and 3, or that indicating the value 1, 2, and 5.

Although only the situation that the biggest value (i.e. the value of 7) of the column selection signal Addr' is designated as the boundary value of the column selection signal Addr' is cited as an example for illustration in the present embodiment of the invention, the boundary value is not limited thereto. In other example, any values of the column selection signal Addr' can be designated as the boundary value.

In the present embodiment, the memory control circuit includes Y-multiplexers for reading boundary cells of present memory blocks in response to one boundary value of a column selection signal, accordingly obtaining sensing signals. The memory control circuit further includes selecting circuit for selecting the sensing signals thereof to determine whether to re-perform the erase operation on the next memory blocks and the boundary cells. Therefore, no matter how the variety of size the memory blocks may have, simple selecting circuits can be used to realize the logic circuits for determining whether to re-perform the erase operation on every memory blocks of the memory array. Consequently, the memory control circuit of the present embodiment can effectively simplify and unify the erase operation on the boundary of different memory blocks.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a first memory block having a first boundary cell; and
a second memory block having a second boundary cell, wherein,
data of the first and the second boundary cells are outputted simultaneously corresponding to a plurality of column selection signals.

2. The memory device according to claim 1, further comprising:
a control circuit comprising:
an address decoder for providing the plurality of column selection signals capable of being a boundary value;
a first Y-multiplexer corresponding to the first memory block and providing a first boundary data channel for the first boundary cell; and
a second Y-multiplexer corresponding to the second memory block and providing a second boundary data channel for the second boundary cell, wherein,
the first boundary data channel and the second boundary data channel are enabled simultaneously in response to the boundary value for outputting boundary data stored in the first and the second boundary cells.

3. The memory device according to claim 2, wherein the control circuit further comprises:
a first sense amplifier, for generating a first sensing signal according to the boundary data stored in the first boundary cell;
a second sense amplifier, for generating a second sensing signal according to the boundary data stored in the second boundary cell;
a first bias circuit, for providing a first erase voltage for erasing the first memory block in response to a first verification signal; and
a second bias circuit, for providing a second erase voltage for erasing the second memory block in response to a second verification signal.

4. The memory device according to claim 3, wherein the control circuit further comprises:
a control logic circuit, for providing an enabled boundary control signal when the column selection signals indicate the boundary value;
a first logic circuit, for providing the first verification signal; and
a second logic circuit, for selecting the first sensing signal as the second verification signal in response to the enabled boundary control signal.

5. The memory device according to claim 4, wherein,
the control circuit further provides a disabled boundary control signal when the column selection signals do not indicate the boundary value;
the second logic circuit further selects the second sensing signal as the second verification signal in response to the disabled boundary control signal; and
the first logic circuit selects the first sensing signal as the first verification signal in response to the disabled boundary control signal.

6. The memory device according to claim 4, wherein,
the first logic circuit selects a default signal as the first verification signal in response to the enabled boundary control signal.

7. The memory device according to claim 4, wherein,
the control circuit further provides an enabled first empty control signal when the column selection signals indicate empty values, no data channels within the first Y-multiplexer enabled in response to the empty values; and
the first logic circuit further provides a default signal as the first verification signal.

8. The memory device according to claim 4, wherein,
the control circuit further provides an enabled second empty control signal when the column selection signals indicate empty values, no data channels within the second Y-multiplexer enabled in response to the empty values; and
the second logic circuit further provides a default signal as the second verification signal.

9. A memory device, comprising:
a first boundary channel corresponding to a first boundary bit; and
a second boundary channel corresponding to a second boundary bit, wherein,
the first and the second boundary channels output the first and the second boundary bits simultaneously corresponding to column selection signals.

10. The memory device according to claim 9, comprising:
a first memory block and a second memory block, the first and the second memory blocks respectively having a first boundary cell storing the first boundary bit and a second boundary cell storing the second boundary bit; and
a control circuit comprising:
an address decoder for providing a plurality of column selection signals capable of being a boundary value;
a first Y-multiplexer corresponding to the first memory block and providing the first boundary data channel for the first boundary cell; and
a second Y-multiplexer corresponding to the second memory block and providing the second boundary data channel for the second boundary cell, wherein:
the first boundary data channel and the second boundary data channel are enabled simultaneously in response to the boundary value for outputting the first and the second boundary bits stored in the first and the second boundary cells.

11. The memory device according to claim 10, wherein the control circuit further comprises:
a first sense amplifier, for generating a first sensing signal according to the first boundary bit stored in the first boundary cell;
a second sense amplifier, for generating a second sensing signal according to the second boundary bit stored in the second boundary cell;
a first bias circuit, for providing a first erase voltage for erasing the first memory block in response to a first verification signal; and
a second bias circuit, for providing a second erase voltage for erasing the second memory block in response to a second verification signal.

12. The memory device according to claim 11, wherein the control circuit further comprises:
a control logic circuit, for providing an enabled boundary control signal when the column selection signals indicate the boundary value;
a first logic circuit, for providing the first verification signal; and a second logic circuit, for selecting the first sensing signal as the second verification signal in response to the enabled boundary control signal.

13. The memory device according to claim 12, wherein, the control circuit further provides a disabled boundary control signal when the column selection signals does not indicate the boundary value;
the second logic circuit further selects the second sensing signal as the second verification signal in response to the disabled boundary control signal; and
the first logic circuit selects the first sensing signal as the first verification signal in response to the disabled boundary control signal.

14. The memory device according to claim 12, wherein, the first logic circuit selects a default signal as the first verification signal in response to the enabled boundary control signal.

15. The memory device according to claim 12, wherein, the control circuit further provides an enabled first empty control signal when the column selection signals indicate empty values, no data channels within the first Y-multiplexer enabled in response to the empty values; and
the first logic circuit further provides a default signal as the first verification signal.

16. The memory device according to claim 12, wherein, the control circuit further provides an enabled second empty control signal when the column selection signals indicate empty values, no data channels within the second Y-multiplexer enabled in response to the empty values; and
the second logic circuit further provides a default signal as the second verification signal.

* * * * *